(12) United States Patent
Aoyama

(10) Patent No.: US 12,027,560 B2
(45) Date of Patent: Jul. 2, 2024

(54) PHOTOELECTRIC CONVERSION DEVICE, PHOTOELECTRIC CONVERSION SYSTEM, MOVING BODY, AND METHOD OF DESIGNING PHOTOELECTRIC CONVERSION DEVICE

(71) Applicant: CANON KABUSHIKI KAISHA, Tokyo (JP)

(72) Inventor: Eiki Aoyama, Chiba (JP)

(73) Assignee: Canon Kabushiki Kaisha, Tokyo (JP)

( * ) Notice: Subject to any disclaimer, the term of this patent is extended or adjusted under 35 U.S.C. 154(b) by 57 days.

(21) Appl. No.: 17/981,712

(22) Filed: Nov. 7, 2022

(65) Prior Publication Data

US 2023/0170374 A1 Jun. 1, 2023

(30) Foreign Application Priority Data

Nov. 26, 2021 (JP) ................. 2021-192465

(51) Int. Cl.
| | |
|---|---|
| *H01L 27/146* | (2006.01) |
| *G06F 30/394* | (2020.01) |
| *H04N 25/71* | (2023.01) |
| *H04N 25/75* | (2023.01) |
| *H04N 25/79* | (2023.01) |

(52) U.S. Cl.
CPC ...... *H01L 27/14636* (2013.01); *G06F 30/394* (2020.01); *H01L 27/14634* (2013.01); *H04N 25/745* (2023.01); *H04N 25/75* (2023.01); *H04N 25/79* (2023.01)

(58) Field of Classification Search
CPC ......... H01L 27/14636; H01L 27/14634; H01L 27/146; H01L 27/1464; H01L 27/14643; H01L 27/1469; G06F 30/394; H04N 25/745; H04N 25/75; H04N 25/79
See application file for complete search history.

(56) References Cited

U.S. PATENT DOCUMENTS

| | | | | |
|---|---|---|---|---|
| 5,488,238 | A | * 1/1996 | Enraku | ............... H01L 27/0207 257/210 |
| 2003/0161128 | A1 | * 8/2003 | Masuda | ............. H01L 23/5286 257/E23.153 |
| 2020/0185445 | A1 | * 6/2020 | Yamagishi | .......... H01L 27/1464 |
| 2024/0006452 | A1 | * 1/2024 | Maeda | ................ H01L 27/1464 |

FOREIGN PATENT DOCUMENTS

JP 2013-058661 A 3/2013

* cited by examiner

*Primary Examiner* — Michael E Teitelbaum
(74) *Attorney, Agent, or Firm* — Venable LLP

(57) ABSTRACT

A photoelectric conversion device comprising a first substrate in which a photoelectric conversion portion is arranged and a second substrate stacked on the first substrate is provided. The second substrate comprises a surface on which a circuit block and a functional cell connected to the block are arranged. Wiring layers including a first layer and a second layer arranged between the first layer and the first substrate are arranged between the first substrate and the surface. The first layer includes first power lines extending in a first direction and arranged in a predetermined period in a second direction, and the second layer includes second power lines arranged in a predetermined period. The functional cell is arranged between two power lines of the first power supply lines, and arranged to fit in a region of any one of the second power lines.

20 Claims, 9 Drawing Sheets

PHOTOELECTRIC CONVERSION DEVICE, PHOTOELECTRIC CONVERSION SYSTEM, MOVING BODY, AND METHOD OF DESIGNING PHOTOELECTRIC CONVERSION DEVICE

BACKGROUND OF THE INVENTION

Field of the Invention

The present invention relates to a photoelectric conversion device, a photoelectric conversion system, a moving body, and a method of designing the photoelectric conversion device.

Description of the Related Art

It has been proposed a stacked structure in a photoelectric conversion device, which is obtained by stacking a substrate where a photoelectric conversion element is arranged and a substrate where a signal processing circuit is arranged, thereby enabling more signal processing operations. There is a case in which the light emitted due to a hot carrier of a transistor included in a logic circuit arranged in the signal processing circuit is detected by the photoelectric conversion element and appear as noise in an image. Japanese Patent Laid-Open No. 2013-058661 describes that, in order to prevent the light emitted from the transistor of the logic circuit from appearing as noise in an image, a light shielding film is provided, in a region of the wiring layer of the logic circuit where no wiring is formed, as a dummy pattern independent of the wiring for signal transmission and reception.

SUMMARY OF THE INVENTION

Japanese Patent Laid-Open No. 2013-058661 describes that the light emitted from the transistor of the logic circuit is shielded by adding the dummy pattern to the wiring layer, but it may be possible to effectively use an existing wiring pattern as the light shielding film.

Some embodiments of the present invention provide a technique advantageous in improving the light shielding effect of a photoelectric conversion device.

According to some embodiments, a photoelectric conversion device that comprises a first substrate in which a photoelectric conversion portion including a plurality of photoelectric conversion elements is arranged, and a second substrate stacked on the first substrate, wherein the second substrate comprises a main surface on which a circuit block and a functional cell electrically connected to the circuit block are arranged, a plurality of wiring layers including a first layer and a second layer arranged between the first layer and the first substrate are arranged between the first substrate and the main surface, the first layer includes a plurality of first power supply lines extending in a first direction and arranged in a predetermined period in a second direction intersecting the first direction, the second layer includes a plurality of second power supply lines arranged in a predetermined period, in an orthogonal projection with respect to the main surface, at least one of a length in the first direction and a length in the second direction of the circuit block is larger than a width of each of the plurality of second power supply lines, and in the orthogonal projection with respect to the main surface, the functional cell is arranged between two power supply lines of the plurality of first power supply lines, and arranged so as to fit in a region of any one of the plurality of second power supply lines, is provided.

According to some other embodiments, a method of designing a photoelectric conversion device that comprises a first substrate in which a photoelectric conversion portion including a plurality of photoelectric conversion elements is arranged, and a second substrate stacked on the first substrate, the method comprising: arranging a circuit block on a main surface of the second substrate; arranging a plurality of wiring layers between the first substrate and the main surface; and arranging, on the main surface, a functional cell electrically connected to the circuit block after the arranging the circuit block and the arranging the plurality of wiring layers, wherein the plurality of wiring layers include a first layer and a second layer arranged between the first layer and the first substrate, the first layer includes a plurality of first power supply lines extending in a first direction and arranged in a predetermined period in a second direction intersecting the first direction, the second layer includes a plurality of second power supply lines arranged in a predetermined period, in an orthogonal projection with respect to the main surface, at least one of a length in the first direction and a length in the second direction of the circuit block is larger than a width of each of the plurality of second power supply lines, and in the arranging the functional cell, the functional cell is arranged at a position which is located between two power supply lines of the plurality of first power supply lines and fits in a region of any one of the plurality of second power supply lines in the orthogonal projection with respect to the main surface, is provided.

Further features of the present invention will become apparent from the following description of exemplary embodiments (with reference to the attached drawings).

DESCRIPTION OF THE EMBODIMENTS

Figure 1:
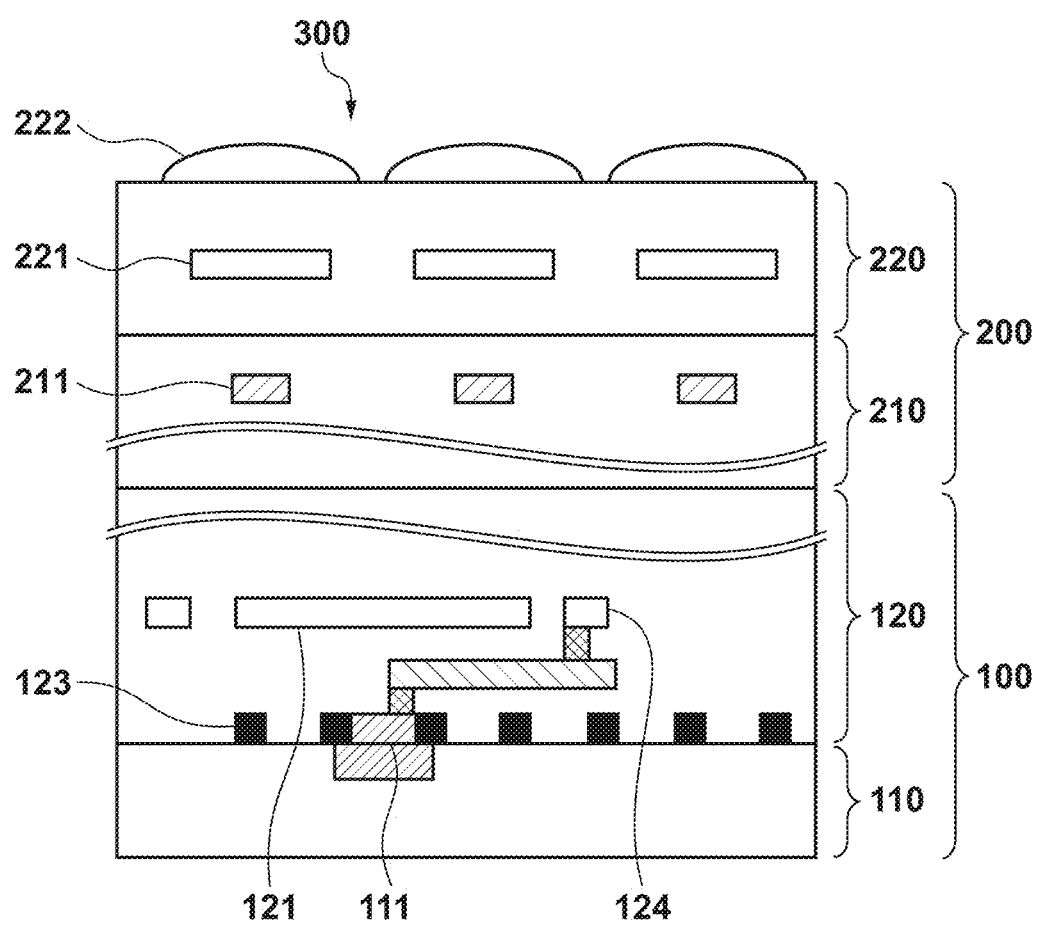
FIG. 1 is a sectional view showing an arrangement example of a circuit included in a photoelectric conversion device according to an embodiment.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

With reference to FIGS. 1 to 9B, a photoelectric conversion device according to an embodiment of the present disclosure will be described. FIG. 1 is a sectional view showing an example of the local arrangement of a photoelectric conversion device 300 in this embodiment. In the photoelectric conversion device 300, a substrate 220 where a photoelectric conversion portion including a plurality of photoelectric conversion elements 221 and a substrate 110 for operating the plurality of photoelectric conversion elements 221 are stacked, and the substrate 220 and the substrate 110 are electrically connected to each other.

A plurality of small lenses 222 are formed on the substrate 220. Light entering from the upper side in FIG. 1 passes through the small lens 222, is condensed to the photoelectric conversion element 221, and is photoelectrically converted into an electric signal. A wiring layer 210 for transmitting a signal for controlling the operation of the photoelectric conversion element 221 and a signal output from the photoelectric conversion element 221 is provided on the substrate 110 side of the substrate 220. In FIG. 1, the wiring layer 210 includes a wiring pattern 211 in one layer, but it may include a plurality of wiring layers. A structure including the substrate 220 and the wiring layer 210 is sometimes referred to as a light receiving element substrate 200 hereinafter.

The electric signal converted by the photoelectric conversion element 221 undergoes signal processing such as digital/analog (D/A) conversion in the signal processing circuit provided on the main surface of the substrate 110, and is output as an electric signal from the photoelectric conversion device 300. Signal processing such as digital CDS (Correlated Double Sampling) processing may also be performed in the signal processing circuit provided on the substrate 110. The signal processing circuit provided on the substrate 110 not only operates the photoelectric conversion element 221 but also controls driving of the photoelectric conversion device 300. A plurality of wiring layers 120 are arranged between the main surface of the substrate 110 and the substrate 220 (light receiving element substrate 200). Wiring patterns used to transmit signals in the signal processing circuit provided on the substrate 110 and transmit/receive signals to/from the light receiving element substrate 200, and the like are formed in the plurality of wiring layers 120. A structure including the substrate 110 and the plurality of wiring layers 120 is sometimes referred to as a signal processing circuit substrate 100 hereinafter.

Various known techniques can be used for the connection between the light receiving element substrate 200 and the signal processing circuit substrate 100. In this embodiment, the two-layered stacking structure formed by the light receiving element substrate 200 and the signal processing circuit substrate 100 is shown, but the photoelectric conversion device 300 may include a structure in which three or more substrates are stacked.

Figure 2:
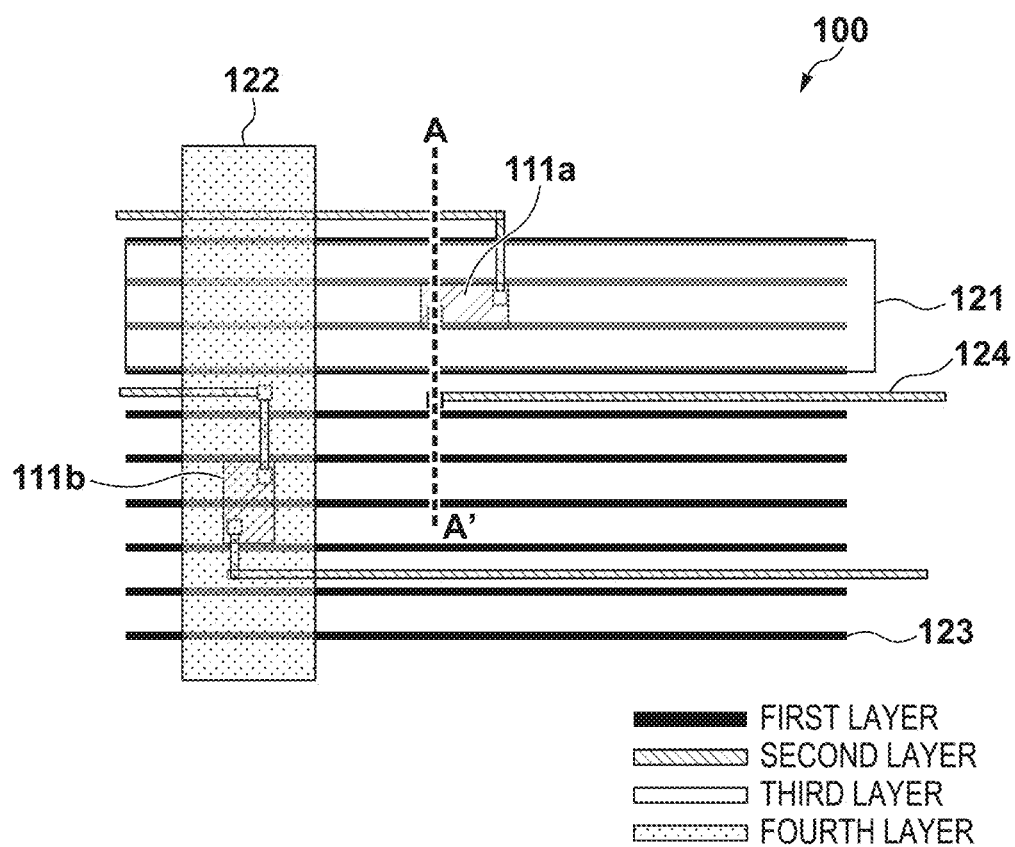
FIG. 2 is a plan view showing the arrangement example of the circuit shown in FIG. 1.
Figure 5:
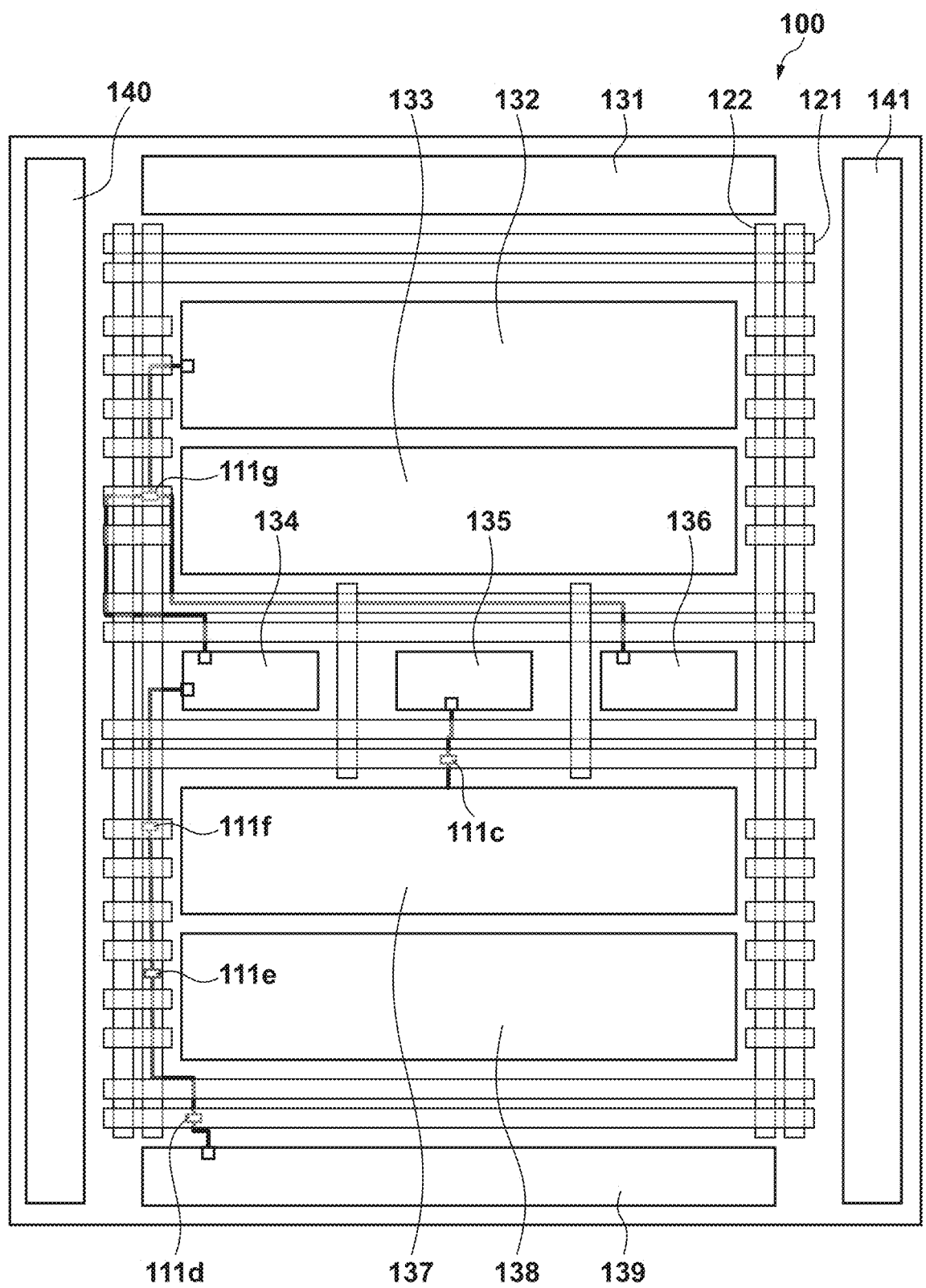
FIG. 5 is a plan view showing an arrangement example of the entire chip of the circuit shown in FIG. 1.

FIG. 2 shows a plan view locally showing the signal processing circuit substrate 100 of the photoelectric conversion device 300. The sectional view shown in FIG. 1 shows the section taken along a line A-A' in FIG. 2. FIG. 5 is a plan view showing an arrangement example of the entire chip of the signal processing circuit substrate 100 of the photoelectric conversion device 300. A description will be given below with reference to FIGS. 1, 2 and 5.

The substrate 110 includes the main surface on which circuit blocks 131 to 141 and functional cells 111 electrically connected to the circuit blocks are arranged. The circuit blocks 131 to 141 and the functional cells 111 correspond to the signal processing circuit described above.

The first layer of the plurality of wiring layers 120, which is closest to the main surface of the substrate 110, includes a plurality of power supply lines 123 extending in the X direction (the horizontal direction in FIG. 2) and arranged in a predetermined period in the Y direction (the vertical direction in FIG. 2) intersecting the X direction. In this embodiment, as shown in FIG. 1, none of the plurality of wiring layers 120 is arranged between the first layer arranged with the power supply lines 123 and the main surface of the substrate 110.

The third layer of the plurality of wiring layers 120 includes a plurality of power supply lines 121 arranged in a predetermined period. The fourth layer of the plurality of wiring layers 120 includes a plurality of power supply lines 122 arranged in a predetermined period. Each of the power supply lines 121, 122, and 123 may be arranged in a predetermined period while, for example, including a pair of a VDD line and a GND (or VSS) line.

Here, in an orthogonal projection with respect to the main surface of the substrate 110, each of the circuit blocks 131 to 141 is formed such that at least one of the X-direction length and the Y-direction length is larger than the width of each of the plurality of power supply lines 121 and 122. On the other hand, the functional cell 111 is arranged so as to fit in the region of any one of the power supply lines 121 and 122 of the plurality of power supply lines 121 and 122 in the orthogonal projection with respect to the main surface of the substrate 110. Further, each functional cell 111 is arranged between two power supply lines 123 of the plurality of power supply lines 123. The functional cell 111 may be arranged between two adjacent power supply lines 123 of the plurality of power supply lines 123, like a functional cell 111a shown in FIG. 2. Further, the functional cell 111 may be arranged between two power supply lines 123 sandwiching one power supply line 123 of the plurality of power supply lines 123, like a functional cell 111b shown in FIG. 2. In this manner, the circuit block can be a circuit having a relatively large circuit scale, and the functional cell 111 can be a circuit having a relatively small circuit scale. For example, the functional cell 111 is a circuit in which 100 or less transistors are arranged. Further, the functional cell 111 can be a circuit in which 50 or less transistors, 20 or less transistors, or 10 or less transistors are arranged.

The functional cell 111 is a circuit that functions as any of an inverter circuit, a buffer circuit, a combinational logic circuit, and a sequential circuit. In this embodiment, the specific circuit structure of the functional cell 111 is not particularly limited, but the functional cell 111 is a circuit which may emit light and give noise to the photoelectric conversion element 221. In this embodiment, as the circuit which emits light, a circuit including transistors will be applied and described.

In the orthogonal projection with respect to the main surface of the substrate 110, the functional cell 111 is arranged so as to overlap the photoelectric conversion portion where the photoelectric conversion elements 221 are arranged. The original function of the photoelectric conversion device 300 is to convert, into an electric signal, an optical signal received from the side on which the small lens 222 is arranged. However, if the transistor included in the functional cell 111 emits light due to a hot carrier or the like, the light emitted from the functional cell 111 can reach the photoelectric conversion element 221 and give noise to the signal output from the photoelectric conversion element 221.

To prevent this, the power supply lines 121 and 122 are arranged at positions so as to cover the functional cells 111. This implements a structure in which even if the transistor included in the functional cell 111 emits light, the light is shielded by the power supply lines 121 and 122, thereby preventing the light emitted by the transistor included in the functional cell 111 from giving noise to the photoelectric conversion element 221.

The functional cell 111 is supplied with power from the power supply line 123 arranged in the first layer of the plurality of wiring layers 120. For example, the functional cell 111 may be arranged between two power supply lines 123 of the plurality of power supply lines 123, and supplied with power from the two power supply lines 123 arranged on the both sides of the functional cell 111. The power supply lines 123 are supplied with power from the power supply lines 121 and 122. That is, each power supply line 123 is connected to the corresponding one of the power supply lines 121 and 122. The power supply line 123 and the power supply lines 121 and 122 are arranged all over the signal processing circuit substrate 100, thereby forming the power supply wiring that allows the circuit blocks 131 to 141 and the functional cells 111 to be arranged anywhere in the signal processing circuit substrate 100 and power supply to them.

Each of the power supply lines 121 and 122 has a wiring width larger than that of the power supply line 123 to supply power to the circuit blocks 131 to 141 and the functional cells 111 arranged in arbitrary places while suppressing a voltage drop caused by a power supply pad. Further, the power supply lines 121 and 122 are arranged regardless of whether the above-described light shielding is performed. In this embodiment, since the power supply lines 121 and 122 which are originally arranged are also used as the light shielding patterns, it is unnecessary to newly arrange the light shielding patterns to shield the light emitted from the functional cells 111. Accordingly, it is possible to effectively use the resources of the wiring layers 120 in the signal processing circuit substrate 100.

For example, when designing the signal processing circuit substrate 100, each functional cell 111 is arranged at a position which is located between two power supply lines 123 of the plurality of power supply lines 123 and fits in the region of any one of the power supply lines 121 and 122 of the plurality of power supply lines 121 and 122 in the orthogonal projection with respect to the main surface of the substrate 110. After the arrangement of the power supply lines 121 and 122 is decided, when arranging the functional cells 111, regions not overlapping the power supply lines 121 and 122 are set as arrangement prohibited regions. With this, the light shielding effect described above can be obtained, and the design complexity is reduced.

Figure 3:
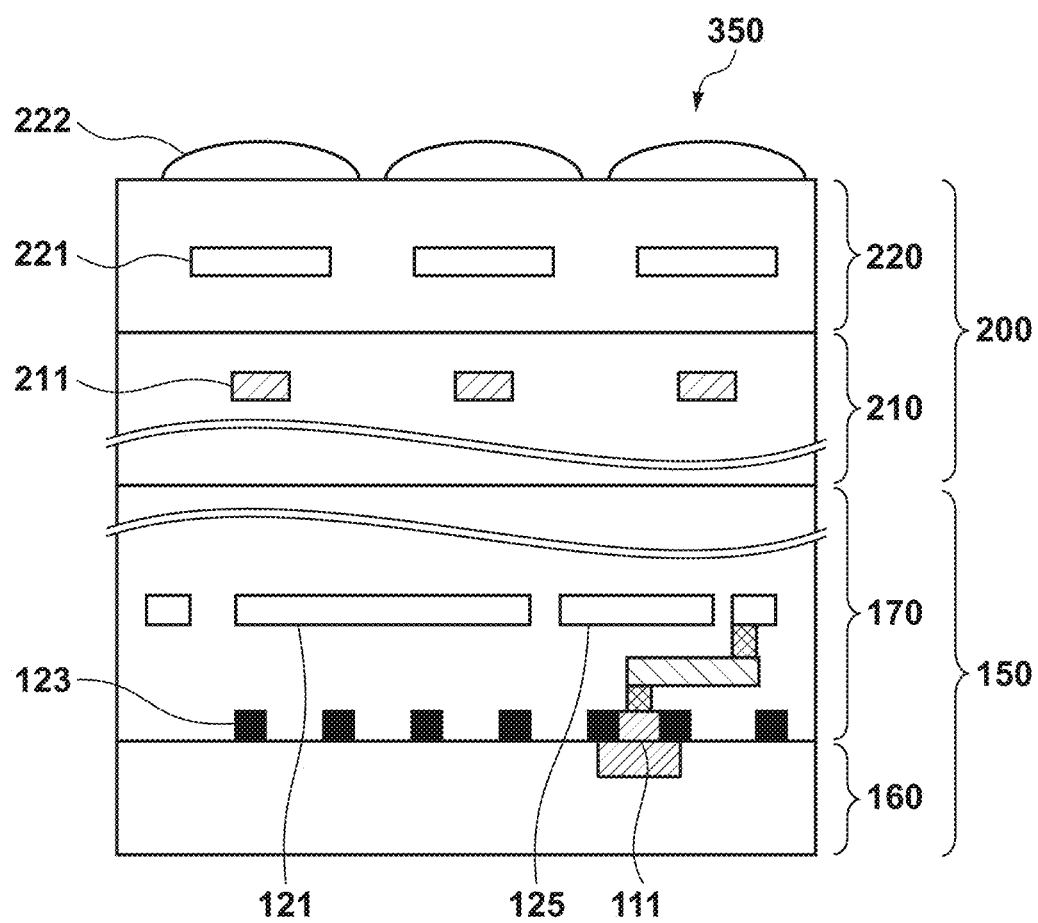
FIG. 3 is a sectional view showing an arrangement example of a circuit of a comparative example.

FIG. 3 shows the sectional structure of a photoelectric conversion device 350 of a comparative example. The photoelectric conversion device 350 of the comparative example includes a signal processing circuit substrate 150 including a substrate 160 and a wiring layer 170. The signal processing circuit substrate 150 of the comparative example is different from the signal processing circuit substrate 100 according to this embodiment in that the arrangement position of the functional cell 111 is changed and there is a light shielding pattern 125 which is arranged to shield the light emitted from the functional cell 111.

As shown in FIG. 3, the functional cell 111 is not arranged at the position covered by the power supply line 121. Therefore, in the signal processing circuit substrate 150 of the comparative example, the light shielding pattern 125 is arranged at a position where no power supply line 121 exists, thereby suppressing that the light emitted from the transistor included in the functional cell 111 causes noise in photoelectric conversion performed in the photoelectric conversion element 221.

Figure 4:
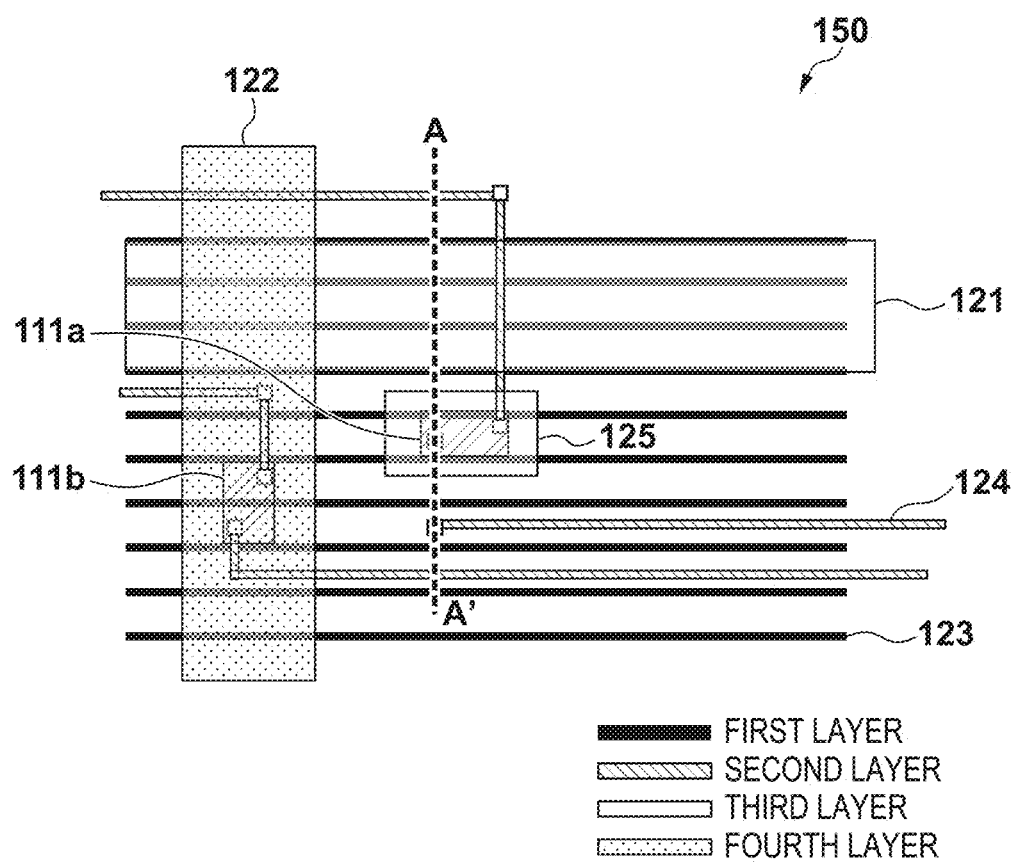
FIG. 4 is a plan view showing the arrangement example of the circuit of the comparative example.

FIG. 4 is a plan view of the photoelectric conversion device 350 of the comparative example. The sectional view shown in FIG. 3 shows the section taken along the line A-A' in FIG. 4. In order to shield the light emitted from the functional cell 111, the light shielding pattern 125 is arranged in the third layer of the wiring layers 120 where the power supply line 121 is also arranged. Therefore, it can be seen that the region where signal wiring patterns 124 can be arranged is smaller than in the signal processing circuit substrate 100 according to this embodiment shown in FIG. 2.

That is, as has been described above, by using the power supply lines 121 and 122 as the light shielding patterns, the region where the wiring patterns can be arranged in the signal processing circuit substrate 100 can be efficiently ensured. Thus, the degree of freedom of laying of the wiring patterns in the signal processing circuit substrate 100 can be improved.

Next, the arrangement of the entire chip of the signal processing circuit substrate 100 will be descried with reference to FIG. 5. As has been described above, the plurality of circuit blocks 131 to 141 are arranged on the main surface of the substrate 110. In FIG. 5, the power supply line 123 is not shown. However, the power supply line 123 is arranged in the first layer of the wiring layers 120 to supply power to the functional cells 111 shown in FIG. 5 and the like. In the orthogonal projection with respect to the main surface of the substrate 110, the plurality of power supply lines 123 may be arranged at positions not overlapping the circuit blocks 131 to 141. This is because many wiring patterns such as signal wiring patterns in the circuit blocks 131 to 141 are arranged in the first layer of the wiring layers 120 of the circuit blocks 131 to 141. Similarly, in the orthogonal projection with respect to the main surface of the substrate 110, the plurality of power supply lines 121 and 122 may be arranged at positions not overlapping the circuit blocks 131 to 141.

Each of the circuit blocks 131 to 141 can function as, for example, any of a scanning circuit for driving the photoelectric conversion portion where the photoelectric conversion elements 221 are arranged, an ADC circuit for A/D-converting a signal output from the photoelectric conversion portion, a signal processing circuit for processing a digital signal converted by the ADC circuit, a timing generator for synchronizing the operation of the photoelectric conversion device, and a control circuit for controlling the operation of the photoelectric conversion device 300. These are some specific examples of the circuit blocks 131 to 141, but this embodiment is not a technique limited to these examples. The number and arrangement positions of the circuit blocks 131 to 141 shown in FIG. 5 are also merely examples, and the arrangement positions thereof are not limited to this.

The circuit block 135 is, for example, a circuit block that functions as the control circuit for controlling the operation of the signal processing circuit substrate 100 of the photoelectric conversion device 300. The circuit block 137 is, for example, a circuit block that functions as the ADC circuit. The functional cells 111 include a buffer circuit that is shown as a functional cell 111c in FIG. 5 arranged between the circuit block 135, which functions as the control circuit, and the circuit block (the circuit block 137 which functions as the ADC circuit) of the plurality of circuit blocks different from the circuit block 135 which functions as the control circuit. The functional cell 111*c* is a relay buffer circuit used to guarantee the signal quality of a control signal transmitted from the circuit block 135, which functions as the control circuit, to the circuit block 137 which functions as the ADC circuit. The functional cell 111*c* is arranged at a position which fits in the region of any one of the power supply lines 121 of the plurality of power supply lines 121 and 122 in the orthogonal projection with respect to the main surface of the substrate 110. Even if the transistor in the functional cell 111 emits light, the light can be shielded by the power supply line 121.

For example, the functional cells 111 may include a buffer circuit arranged between the circuit block (any one of the circuit blocks 131 to 134, 136, 138 to 141), which functions as the timing generator, and the circuit block of the plurality of circuit blocks different from the circuit block which functions as the timing generator (any one of the circuit blocks 131 to 141 other than the circuit block which functions as the timing generator). Further, for example, the functional cells may include a buffer circuit arranged between one of the circuit blocks 131 to 141 and a pad configured to output a signal from the substrate 110 or input a signal to the substrate 110.

In addition to this, for example, multiple functional cells 111 may be arranged in one path connected to the circuit blocks 131 to 141, like functional cells 111*d*, 111*e*, and 111*f* arranged in the wiring pattern between the circuit block 134 and the circuit block 139. Further, for example, this embodiment can be applied to a functional cell 111*g* arranged when inputting an output signal of the circuit block 134 and an output signal of the circuit block 136 to the circuit block 132 based on combinational logic. In this case, for example, the functional cell 111*g* functions as a combinational logic circuit such as an AND circuit or an OR circuit.

As shown in FIG. 5, a plurality of the functional cells 111 are arranged on the signal processing circuit substrate 100 (substrate 110). Depending on the scale of the photoelectric conversion device 300, there can be a case in which the number of the functional cells 111 arranged therein can reach tens of thousands to hundreds of thousands. In such the case, it is difficult in design to arrange the light shielding pattern 125 for each of the functional cells 111. On the other hand, this embodiment has an advantage that, by arranging the functional cells 111 at positions covered by the power supply lines 121 and 122, it is unnecessary to individually arrange the light shielding pattern 125 so that light shielding can be efficiently performed. When arranging the functional cell 111 in design, by simply setting regions not overlapping the power supply lines 121 and 122 as arrangement prohibited regions, the effect of shielding light from the functional cell 111 can be obtained.

As has been described above, although the number of the functional cells 111, which may emit light to be shielded, is enormous, since the power supply lines 121 and 122 are arranged anywhere in the signal processing circuit substrate 100, it is unnecessary to implement the light shielding pattern 125 for each functional cell 111. As a result, it is easier to shield light emitted from the functional cell 111.

Further, by using the power supply lines 121 and 122 as the light shielding patterns, in the signal processing circuit substrate 100, the functional cells 111 can be arranged at suitable positions in terms of the power and operating performance. This will be described below.

Figure 6:
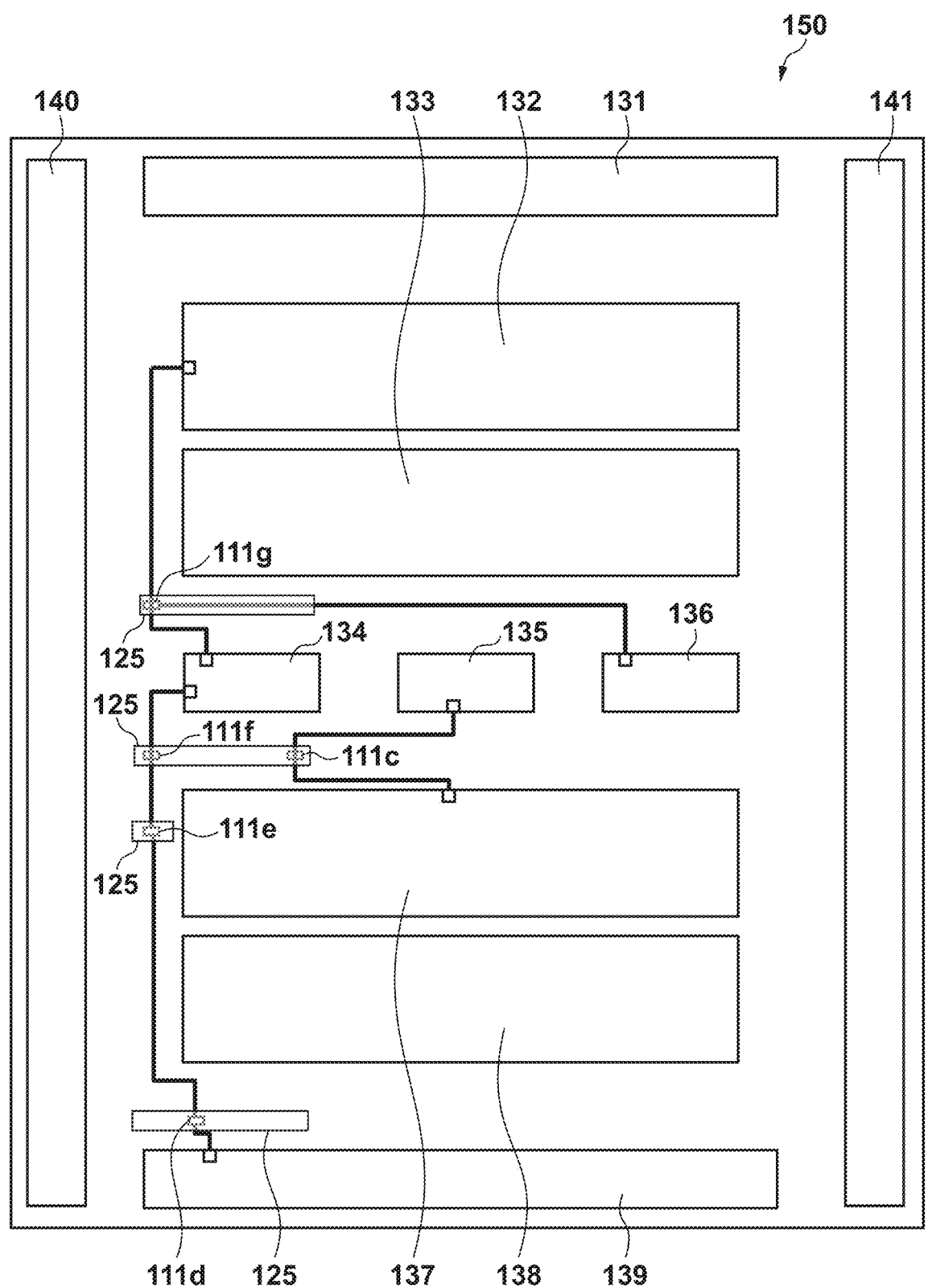
FIG. 6 is a plan view showing an arrangement example of the entire chip of the circuit of the comparative example.

FIG. 6 shows a plan view of the entire chip of the signal processing circuit substrate 150 of the comparative example shown in FIGS. 3 and 4. As has been described above, in the signal processing circuit substrate 150 of the comparative example, the power supply lines 121 and 122 are not used for light shielding, and the light shielding pattern 125 is arranged. In FIG. 6, for illustrative clarity of the positions of the light shielding patterns 125, the power supply lines 121 and 122 are not shown.

As has been described above, there is a case in which tens of thousands to hundreds of thousands of the functional cells 111 are arranged in the signal processing circuit substrate 150. In such the case, it is difficult for a designer to manually arrange the light shielding pattern 125 for each of the enormous number of the functional cells 111. Therefore, there is a method in which the light shielding patterns 125 are arranged in advance, and the functional cells 111 are arranged in regions overlapping the light shielding patterns 125.

In this case, the arrangement positions of the light shielding patterns 125 and the functional cells 111 are those as shown in FIG. 6. In the example shown in FIG. 6, as compared to the signal processing circuit substrate 100 of this embodiment shown in FIG. 5, the functional cell 111*c* is arranged at a position far from the intermediate position between the circuit block 137 and the circuit block 135, and a larger wiring capacitance is applied to the output of the functional cell 111*c*. That is, this is the arrangement in which excessive power consumption occurs. Further, as shown in FIG. 6, the functional cells 111*d*, 111*e*, 111*f*, and 111*g* must be arranged at positions different from the positions in the arrangement shown in FIG. 5 depending on the arrangement positions of the light shielding patterns 125. Therefore, it can be seen that, depending on the arrangement of the light shielding pattern 125, the functional cell 111 cannot be arranged at a suitable position in terms of the power and operating performance.

As shown in FIG. 5, since the power supply lines 121 and 122 are arranged in many places in the signal processing circuit substrate 100, the degree of freedom of the arrangement position of the functional cell 111 is high. Therefore, according to this embodiment, it is possible to arrange the functional cell 111 at a suitable position in terms of the power and operational performance.

Next, a method of arranging the power supply lines 121 and 122 to ensure more light-shielded regions will be described. It has been described above that the power supply lines 123 are arranged to supply power to the functional cells 111. In addition, as has been described above, the arrangement position of the functional cell 111 is defined by the arrangement positions of the power supply lines 123. More specifically, the functional cell 111 is arranged between two power supply lines 123 of the plurality of power supply lines 123.

Figure 7A:
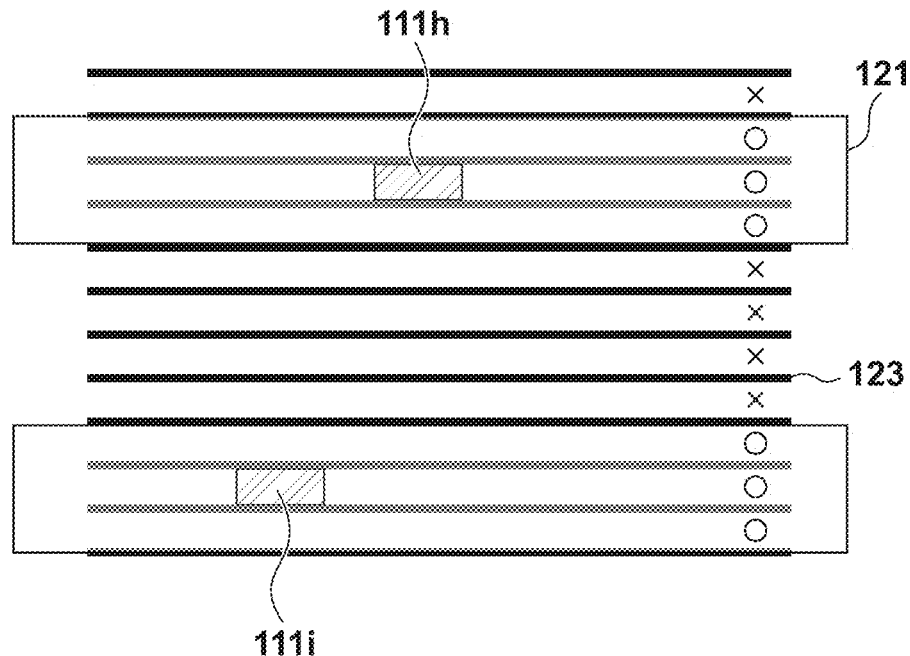
FIGS. 7A and 7B are plan views each showing an arrangement example of the circuit shown in FIG. 1.
Figure 7B:
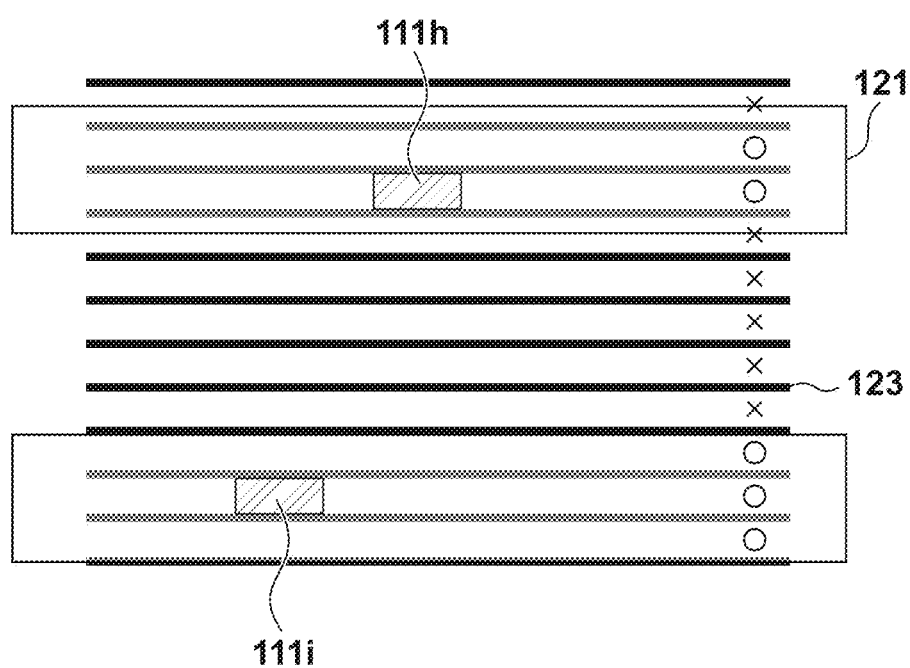

Here, consider the power supply line 121 of the power supply lines 121 and 122, which extends in the same direction as the power supply line 123. FIG. 7A shows an arrangement example of the power supply lines 121 with which more light-shielded regions can be ensured. FIG. 7B shows an arrangement example of the power supply lines 121 with which the light-shielded regions decrease as compared to the example shown in FIG. 7A. In the example shown in FIG. 7A, the power supply lines 121 can shield light for regions corresponding to six rows between the power supply lines 123. On the other hand, in the example shown in FIG. 7B, the power supply lines 121 can shield light for regions corresponding to five rows between the power supply lines 123. That is, the arrangement shown in FIG. 7A can ensure more light-shielded regions than in the arrangement shown in FIG. 7B.

That is, the width of the power supply line 121 is set to an integral multiple of the arrangement period of the power supply lines 123. Further, the arrangement start position of the power supply line 123 is matched with the arrangement start position of the power supply line 121. In other words, in the orthogonal projection with respect to the main surface of the substrate 110, the end portion of the power supply line 121 in a direction intersecting the direction in which the power supply lines 121 and 123 extend is arranged so as to overlap any of the plurality of power supply lines 123. With this, the light-shielded region can be efficiently ensured.

Figure 8:
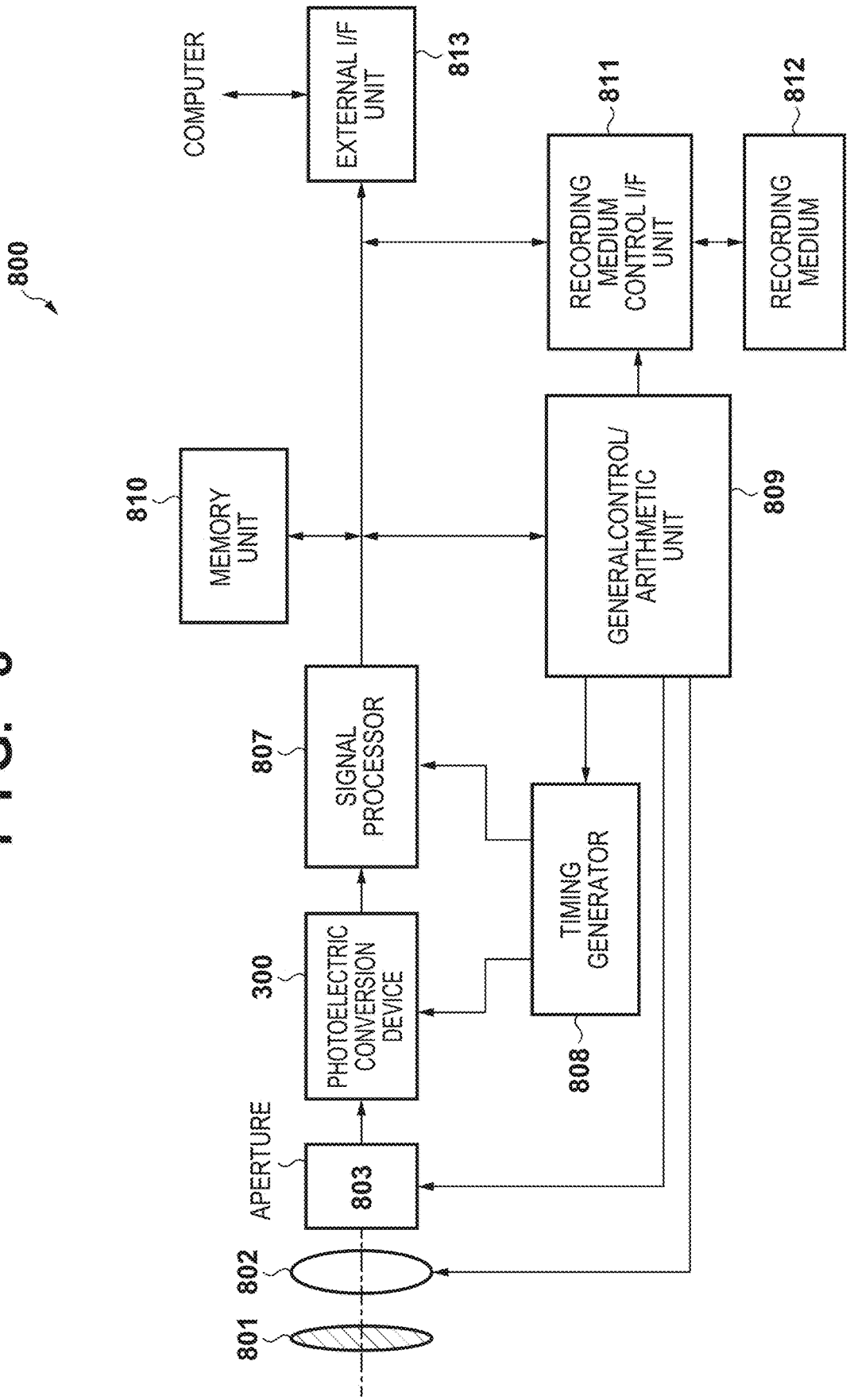
FIG. 8 is a block diagram showing a configuration example of a photoelectric conversion system incorporating the photoelectric conversion device shown in FIG. 1.

An application example of the photoelectric conversion device 300 according to this embodiment will now be described. FIG. 8 is a block diagram showing the schematic configuration of a photoelectric conversion system 800 incorporating the photoelectric conversion device 300.

The above-described photoelectric conversion device 300 of this embodiment can be applied to various kinds of photoelectric conversion systems. Examples of photoelectric conversion systems to which the photoelectric conversion device is applicable are a digital still camera, a digital camcorder, a monitoring camera, a copying machine, a facsimile apparatus, a mobile phone, an in-vehicle camera, and an observation satellite. A camera module including an optical system such as a lens and a photoelectric conversion device is also included in the photoelectric conversion systems. FIG. 8 shows the block diagram of a digital still camera as an example of these.

The photoelectric conversion system 800 shown in FIG. 8 includes the photoelectric conversion device 300, a lens 802 that forms an optical image of an object on the photoelectric conversion portion of the photoelectric conversion device 300, an aperture 803 configured to change the amount of light passing through the lens 802, and a barrier 801 configured to protect the lens 802. The lens 802 and the aperture 803 form an optical system that condenses light to the photoelectric conversion device 300. The photoelectric conversion device 300 converts the optical image formed by the lens 802 into an electrical signal.

The photoelectric conversion system 800 also includes a signal processor 807 that is an image generator configured to generate an image by processing an output signal output from the photoelectric conversion device 300. The signal processor 807 performs an operation of performing various kinds of correction and compression as needed, thereby outputting image data. The signal processor 807 may be formed on a semiconductor substrate (for example, the substrate 110) on which the photoelectric conversion device 300 is provided, or may be formed on a semiconductor substrate different from the photoelectric conversion device 300.

The photoelectric conversion system 800 further includes a memory unit 810 configured to temporarily store image data, and an external interface unit (external I/F unit) 813 configured to communicate with an external computer or the like. Furthermore, the photoelectric conversion system 800 includes a recording medium 812 such as a semiconductor memory configured to record or read image capturing data, and a recording medium control interface unit (recording medium control I/F unit) 811 configured to perform record or read for the recording medium 812. Note that the recording medium 812 may be incorporated in the photoelectric conversion system 800 or may be detachable.

Furthermore, the photoelectric conversion system 800 includes a general control/arithmetic unit 809 that controls various kinds of operations and the entire digital still camera, and a timing generator 808 that outputs various kinds of timing signals to the photoelectric conversion device 300 and the signal processor 807. In this example, the timing signal and the like may be input from the outside, and the photoelectric conversion system 800 need only include at least the photoelectric conversion device 300, and the signal processor 807 that processes an output signal output from the photoelectric conversion device 300.

The photoelectric conversion device 300 outputs an image capturing signal to the signal processor 807. The signal processor 807 executes predetermined signal processing for the image capturing signal output from the photoelectric conversion device 300, and outputs image data. The signal processor 807 generates an image using the image capturing signal.

As described above, according to this embodiment, it is possible to implement the photoelectric conversion system to which the above-described photoelectric conversion device 300 (for example, an image capturing device) is applied.

Figure 9A:
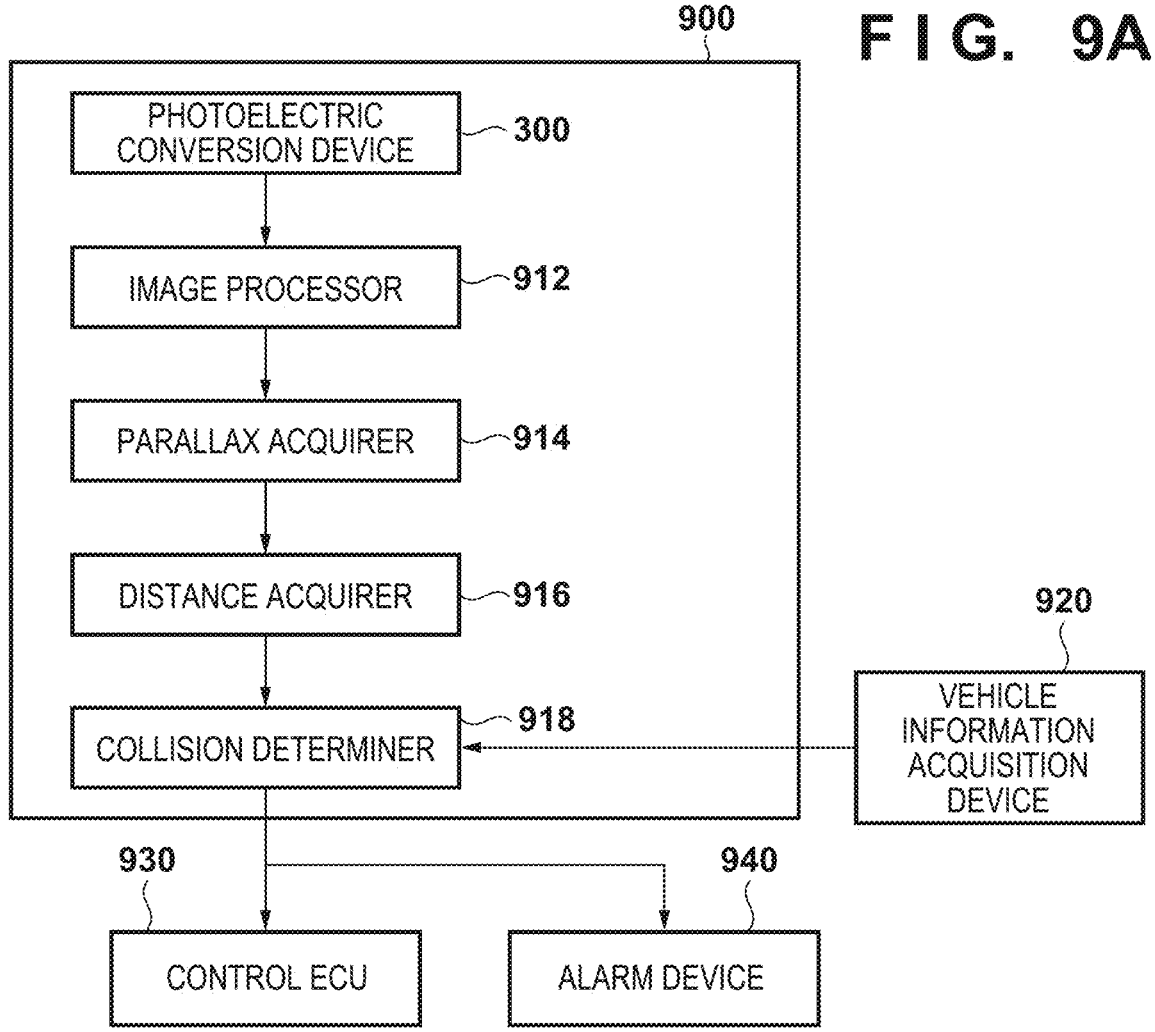
FIGS. 9A and 9B are views showing an arrangement example of a moving body incorporating the photoelectric conversion device shown in FIG. 1.
Figure 9B:
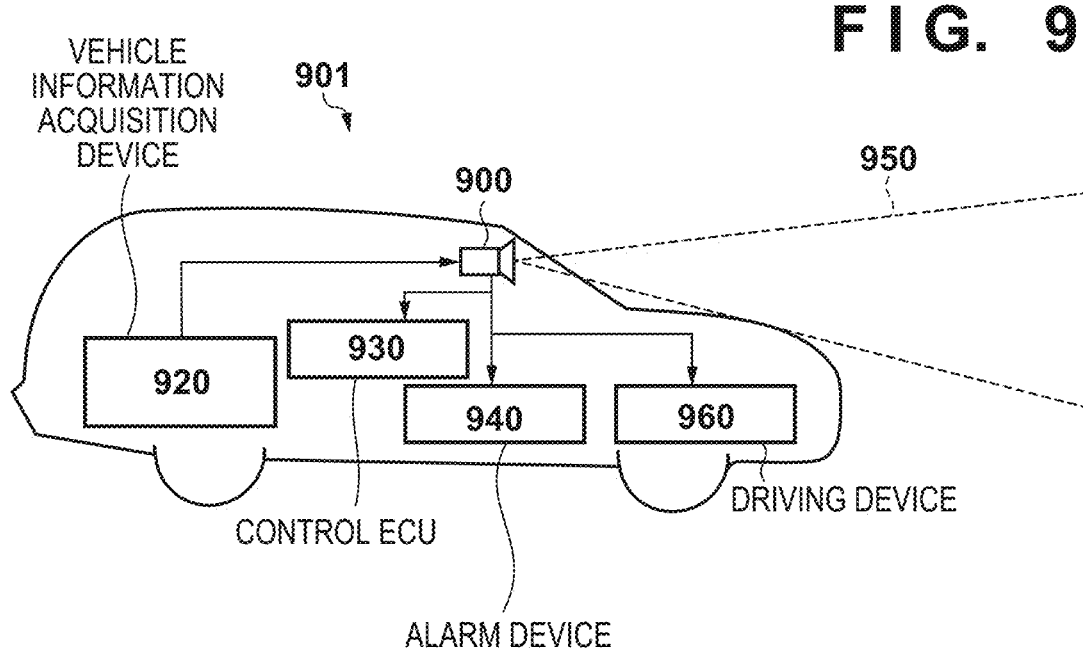

A photoelectric conversion system incorporating the photoelectric conversion device 300 of this embodiment and a moving body will be described next with reference to FIGS. 9A and 9B. FIGS. 9A and 9B are views showing the configuration of a photoelectric conversion system 900 incorporating the photoelectric conversion device 300 according to this embodiment and the configuration of a transport apparatus 901 as a moving body incorporating the photoelectric conversion system 900.

FIG. 9A shows an example of the photoelectric conversion system 900 concerning an in-vehicle camera. The photoelectric conversion system 900 includes an image processor 912 that performs signal processing such as image processing for a plurality of image data acquired by the photoelectric conversion device 300 of this embodiment, and a parallax acquirer 914 that calculates a parallax (the phase difference between parallax images) from the plurality of image data that have undergone the signal processing by the image processor 912. The photoelectric conversion system 900 also includes a distance acquirer 916 that calculates the distance up to a target based on the calculated parallax, and a collision determiner 918 that determines, based on the calculated distance, whether there is collision possibility. Here, the parallax acquirer 914 and the distance acquirer 916 are examples of a distance information acquirer that acquires distance information up to a target. That is, the distance information is information concerning a parallax, a defocus amount, a distance up to a target, and the like. The collision determiner 918 may determine collision possibility using one of the pieces of distance information. The distance information acquirer may be implemented by exclusively designed hardware, or may be implemented by a software module. The distance information acquirer may be implemented by an FPGA (Field Programmable Gate Array) or ASIC (Application Specific Integrated Circuit), or may be implemented by a combination of these.

The photoelectric conversion system 900 is connected to a vehicle information acquisition device 920 of the transport apparatus 901 (for example, a vehicle) including a driving device, and can acquire vehicle information such as a vehicle speed, a yaw rate, and a steering angle. The photoelectric conversion system 900 is also connected to a control ECU 930 that is a control device configured to output a control signal for generating a braking force to the vehicle based on the determination result of the collision determiner 918. Furthermore, the photoelectric conversion system 900 is connected to an alarm device 940 that generates an alarm to the driver based on the determination result of the collision determiner 918. For example, if collision possibility is high as the determination result of the collision determiner 918, the control ECU 930 performs vehicle control of braking, releasing the accelerator pedal, or suppressing the engine output, thereby avoiding collision and reducing damage. The alarm device 940 sounds an alarm, displays alarm information on the screen of a car navigation system or the like, or applies a vibration to the seat belt or a steering wheel, thereby making an alarm to the user.

In this embodiment, the periphery of the transport apparatus 901, for example, the front or rear side is captured by the photoelectric conversion system 900. FIG. 9B shows the photoelectric conversion system 900 in a case in which the front side (image capturing range 950) of the transport apparatus 901 is captured. The vehicle information acquisition device 920 sends an instruction to the photoelectric conversion system 900 or the photoelectric conversion device 300. With this configuration, it is possible to further improve the accuracy of distance measurement.

An example in which a driving device 960 such as the brake, the accelerator, and the engine of the transport apparatus 901 is controlled based on information obtained by the photoelectric conversion device 300 so as not to collide with another vehicle has been described. However, the present invention is not limited to this, and the system can also be applied to control of performing automated driving following another vehicle or control of performing automated driving without deviating from a lane. Furthermore, an example in which the photoelectric conversion system 900 incorporating the photoelectric conversion device 300 is incorporated in the transport apparatus 901 has been described. However, the photoelectric conversion device 300 may be incorporated in the vehicle information acquisition device 920, the control ECU 930, or the alarm device 940. The photoelectric conversion system 900 incorporating the photoelectric conversion device 300 can be applied not only to a vehicle such as an automobile but also to, for example, a transport apparatus including a driving device, such as a ship, an airplane, a railroad vehicle, or an industrial robot. In addition, the photoelectric conversion system can be applied not only to a moving body but also to an apparatus that broadly uses object recognition, such as an intelligent transport system (ITS).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-192465, filed Nov. 26, 2021, which is hereby incorporated by reference herein in its entirety.

What is claimed is:

1. A photoelectric conversion device that comprises a first substrate in which a photoelectric conversion portion including a plurality of photoelectric conversion elements is arranged, and a second substrate stacked on the first substrate, wherein
the second substrate comprises a main surface on which a circuit block and a functional cell electrically connected to the circuit block are arranged,
a plurality of wiring layers including a first layer and a second layer arranged between the first layer and the first substrate are arranged between the first substrate and the main surface,
the first layer includes a plurality of first power supply lines extending in a first direction and arranged in a predetermined period in a second direction intersecting the first direction,
the second layer includes a plurality of second power supply lines arranged in a predetermined period,
in an orthogonal projection with respect to the main surface, at least one of a length in the first direction and a length in the second direction of the circuit block is larger than a width of each of the plurality of second power supply lines, and
in the orthogonal projection with respect to the main surface, the functional cell is arranged between two power supply lines of the plurality of first power supply lines, and arranged so as to fit in a region of any one of the plurality of second power supply lines.

2. The device according to claim 1, wherein
in the orthogonal projection with respect to the main surface, the functional cell is arranged so as to overlap the photoelectric conversion portion.

3. The device according to claim 1, wherein
the functional cell is supplied with power from the two power supply lines.

4. The device according to claim 1, wherein
each of the plurality of first power supply lines is connected to a corresponding second power supply line of the plurality of second power supply lines.

5. The device according to claim 1, wherein
in the orthogonal projection with respect to the main surface, each of the plurality of first power supply lines is arranged at a position not overlapping the circuit block.

6. The device according to claim 1, wherein
in the orthogonal projection with respect to the main surface, each of the plurality of second power supply lines is arranged at a position not overlapping the circuit block.

7. The device according to claim 1, wherein
the plurality of second power supply lines include a third power supply line extending in the first direction, and
a width of the third power supply line is an integral multiple of the period in which the plurality of first power supply lines are arranged.

8. The device according to claim 7, wherein
in the orthogonal projection with respect to the main surface, an end portion of the third power supply line in the second direction is arranged so as to overlap any of the plurality of first power supply lines.

9. The device according to claim 1, wherein
none of the plurality of wiring layers is arranged between the first layer and the main surface.

10. The device according to claim 1, wherein
the functional cell functions as any of an inverter circuit, a buffer circuit, a combinational logic circuit, and a sequential circuit.

11. The device according to claim 1, wherein
the circuit block functions as any of a scanning circuit configured to drive the photoelectric conversion portion, an ADC circuit configured to A/D-convert a signal output from the photoelectric conversion portion, a signal processing circuit configured to process a digital signal converted by the ADC circuit, a timing generator configured to synchronize an operation of the photoelectric conversion device, and a control circuit configured to control the operation of the photoelectric conversion device.

12. The device according to claim 1, wherein
a plurality of the circuit blocks are arranged on the main surface,
the plurality of the circuit blocks include a circuit block that functions as a timing generator configured to synchronize an operation of the photoelectric conversion device, and
the functional cell includes a buffer circuit arranged between the circuit block, which functions as the timing generator, and one of the plurality of the circuit blocks different from the circuit block which functions as the timing generator.

13. The device according to claim 1, wherein
a plurality of the circuit blocks are arranged on the main surface,
the plurality of the circuit blocks include a circuit block that functions as a control circuit configured to control an operation of the photoelectric conversion device, and
the functional cell includes a buffer circuit arranged between the circuit block, which functions as the control circuit, and one of the plurality of the circuit blocks different from the circuit block which functions as the control circuit.

14. The device according to claim 1, wherein
the functional cell includes a buffer circuit arranged between the circuit block and a pad configured to output a signal from the second substrate or input a signal to the second substrate.

15. The device according to claim 1, wherein
a plurality of the functional cells are arranged in one path connected to the circuit block.

16. The device according to claim 1, wherein
the number of transistors arranged in the functional cell is not more than 100.

17. The device according to claim 1, wherein
the functional cell is arranged between two adjacent power supply lines of the plurality of first power supply lines or between two power supply lines of the plurality of first power supply lines sandwiching one power supply line of the plurality of first power supply lines.

18. A photoelectric conversion system comprising:
the photoelectric conversion device according to claim 1; and
a signal processor configured to process a signal output from the photoelectric conversion device.

19. A moving body that comprises a driving device, wherein
the moving body incorporates the photoelectric conversion device according to claim 1, and
the moving body comprises a control device configured to control the driving device based on information acquired by the photoelectric conversion device.

20. A method of designing a photoelectric conversion device that comprises a first substrate in which a photoelectric conversion portion including a plurality of photoelectric conversion elements is arranged, and a second substrate stacked on the first substrate, the method comprising:
arranging a circuit block on a main surface of the second substrate;
arranging a plurality of wiring layers between the first substrate and the main surface; and
arranging, on the main surface, a functional cell electrically connected to the circuit block after the arranging the circuit block and the arranging the plurality of wiring layers,
wherein
the plurality of wiring layers include a first layer and a second layer arranged between the first layer and the first substrate,
the first layer includes a plurality of first power supply lines extending in a first direction and arranged in a predetermined period in a second direction intersecting the first direction,
the second layer includes a plurality of second power supply lines arranged in a predetermined period,
in an orthogonal projection with respect to the main surface, at least one of a length in the first direction and a length in the second direction of the circuit block is larger than a width of each of the plurality of second power supply lines, and
in the arranging the functional cell, the functional cell is arranged at a position which is located between two power supply lines of the plurality of first power supply lines and fits in a region of any one of the plurality of second power supply lines in the orthogonal projection with respect to the main surface.

* * * * *